(12) United States Patent
Bangalore Umesh et al.

(10) Patent No.: US 11,915,915 B2
(45) Date of Patent: Feb. 27, 2024

(54) APPARATUS FOR GENERATING MAGNETIC FIELDS DURING SEMICONDUCTOR PROCESSING

(71) Applicant: Applied Materials, Inc., Santa Clara, CA (US)

(72) Inventors: Suhas Bangalore Umesh, Sunnyvale, CA (US); Martin Lee Riker, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 302 days.

(21) Appl. No.: 17/334,636

(22) Filed: May 28, 2021

(65) Prior Publication Data

US 2022/0384158 A1 Dec. 1, 2022

(51) Int. Cl.
| | |
|---|---|
| *H01J 37/32* | (2006.01) |
| *H01F 7/02* | (2006.01) |
| *C23C 14/54* | (2006.01) |
| *C23C 14/24* | (2006.01) |
| *C23C 14/14* | (2006.01) |
| *C23C 14/35* | (2006.01) |

(52) U.S. Cl.
CPC ........ *H01J 37/32669* (2013.01); *C23C 14/14* (2013.01); *C23C 14/24* (2013.01); *C23C 14/351* (2013.01); *C23C 14/54* (2013.01); *H01F 7/02* (2013.01); *H01J 37/3266* (2013.01); *H01J 2237/332* (2013.01)

(58) Field of Classification Search
CPC .............................. C23C 14/35; C23C 14/351
See application file for complete search history.

(56) References Cited

U.S. PATENT DOCUMENTS

| | | | |
|---|---|---|---|
| 4,842,683 A | | 6/1989 | Cheng et al. |
| 5,213,658 A | * | 5/1993 | Ishida ............... H01J 37/32697 427/571 |
| 5,455,197 A | * | 10/1995 | Ghanbari ........... C23C 14/0036 204/298.03 |
| 5,902,461 A | | 5/1999 | Xu et al. |
| 6,077,404 A | | 6/2000 | Wang et al. |
| 6,562,189 B1 | * | 5/2003 | Quiles ............... H01J 37/32871 156/345.43 |
| 6,579,421 B1 | | 6/2003 | Fu |
| 6,673,716 B1 | | 1/2004 | D'Couto et al. |
| 8,778,151 B2 | | 7/2014 | Ikeda et al. |

(Continued)

OTHER PUBLICATIONS

International Search Report for PCT/US2022/026291, dated Aug. 9, 2022.

*Primary Examiner* — Keath T Chen
(74) *Attorney, Agent, or Firm* — Moser Taboa

(57) ABSTRACT

A plasma vapor deposition (PVD) chamber used for depositing material includes an apparatus for influencing ion trajectories during deposition in an edge region of a substrate. The apparatus includes a reflector assembly that surrounds a substrate support and is configured to reflect heat to the substrate during reflowing of material deposited on the substrate and a plurality of permanent magnets embedded in the reflector assembly that are configured to influence ion trajectories on the edge region of the substrate during deposition processes, the plurality of permanent magnets are spaced symmetrically around the reflector assembly.

20 Claims, 6 Drawing Sheets

(56) References Cited

U.S. PATENT DOCUMENTS

| | | | | |
|---|---|---|---|---|
| 8,919,279 | B1* | 12/2014 | Bourez | C23C 16/50 |
| | | | | 156/345.46 |
| 10,790,180 | B2* | 9/2020 | Hsu | H01J 37/32715 |
| 2002/0066669 | A1* | 6/2002 | Kadokura | C23C 14/352 |
| | | | | 204/298.18 |
| 2002/0142615 | A1* | 10/2002 | Kanno | H01J 37/3266 |
| | | | | 156/345.46 |
| 2004/0094509 | A1 | 5/2004 | Miyata et al. | |
| 2004/0112294 | A1* | 6/2004 | Allen | H01J 37/32623 |
| | | | | 118/728 |
| 2006/0076231 | A1* | 4/2006 | Wei | C23C 14/046 |
| | | | | 204/192.15 |
| 2009/0078571 | A1* | 3/2009 | Abarra | H01J 37/3455 |
| | | | | 204/298.16 |
| 2011/0056912 | A1* | 3/2011 | Matsuyama | H01J 37/32623 |
| | | | | 427/571 |
| 2011/0200749 | A1* | 8/2011 | Suzuki | C23C 16/455 |
| | | | | 118/730 |
| 2015/0155193 | A1* | 6/2015 | Hsu | H01L 21/6833 |
| | | | | 156/345.24 |
| 2015/0214473 | A1* | 7/2015 | Hurley | H10N 50/01 |
| | | | | 438/3 |
| 2018/0219187 | A1* | 8/2018 | Inoue | C23C 14/243 |
| 2019/0244754 | A1* | 8/2019 | Yang | H01J 37/3452 |
| 2021/0391214 | A1* | 12/2021 | Zhong | C23C 14/5806 |

\* cited by examiner

APPARATUS FOR GENERATING MAGNETIC FIELDS DURING SEMICONDUCTOR PROCESSING

FIELD

Embodiments of the present principles generally relate to semiconductor manufacturing.

BACKGROUND

During semiconductor manufacturing, layers of different materials are etched or deposited on a substrate to form semiconductor structures. In general, depositing the layers in an even or uniform fashion is highly desirable to allow fine control over the semiconductor processes. However, the inventors have observed that often, the deposition of materials in physical vapor deposition (PVD) chambers are not highly uniform due to poor ion capture by the substrate during the deposition processes.

Accordingly, the inventors have provided an apparatus that facilitates in capturing ions on the substrate during PVD processes, leading to superior deposition performance.

SUMMARY

Apparatus for influencing ion capture on a substrate during PVD processes are provided herein.

In some embodiments, an apparatus for influencing ion trajectories onto a substrate may comprise an annular assembly configured to completely surround a periphery of the substrate during processing in a physical vapor deposition (PVD) chamber and a plurality of discrete permanent magnets embedded in the annular assembly and spaced symmetrically around the annular assembly, the plurality of discrete permanent magnets configured to influence ion trajectories at an edge region of the substrate during plasma deposition and affect deposition uniformity in the edge region of the substrate.

In some embodiments, the apparatus may further include wherein the annular assembly is a lamp reflector configured to reflect heat to reflow deposition materials during processing in the PVD chamber, wherein one or more of the plurality of discrete permanent magnets are retained in the annular assembly by a plug inserted beneath the one or more of the plurality of discrete permanent magnets, wherein the plug includes a gas relief hole, wherein one or more of the plurality of discrete permanent magnets are retained in the annular assembly by a captive retention apparatus configured to at least partially block a magnet insertion hole beneath the one or more of the plurality of discrete permanent magnets, further including one or more gas relief holes in the annular assembly, wherein the one or more gas relief holes are configured to allow gas to pass from around the plurality of discrete permanent magnets during drawn down of the PVD chamber, wherein the plurality of discrete permanent magnets are cylindrical magnets that are inserted into vertical holes in the annular assembly, wherein the plurality of discrete permanent magnets are oriented south pole up, wherein the plurality of discrete permanent magnets have a diameter of approximately 0.5 inches to approximately 0.75 inches and a height of approximately 2.0 inches to approximately 3.0 inches, wherein the plurality of discrete permanent magnets have a maximum energy product of at least 45 MGOe, wherein the annular assembly has cooling channels that are configured to cool the annular assembly and the plurality of discrete permanent magnets, wherein the plurality of discrete permanent magnets are configured to provide an increase in B-field of approximately 15 gauss at the edge region of the substrate, wherein the plurality of discrete permanent magnets are configured to provide perpendicular ion trajectories onto the substrate in the edge region of the substrate, and/or wherein the plurality of discrete permanent magnets includes at least 16 magnets.

In some embodiments, an apparatus for depositing copper onto a substrate may comprise a physical vapor deposition (PVD) chamber with a processing volume for depositing the copper on the substrate and a reflow capability for reflowing copper deposited on the substrate, a substrate support that is configured to hold the substrate for processing within the PVD chamber, a reflector assembly that surrounds the substrate support and is configured to reflect heat to the substrate during reflowing of copper deposited on the substrate, and a plurality of permanent magnets embedded in the reflector assembly that are configured to influence ion trajectories on an edge region of the substrate during copper deposition processes, the plurality of permanent magnets is spaced symmetrically around the reflector assembly.

In some embodiments, the apparatus may further include one or more gas relief holes in the reflector assembly, wherein the one or more gas relief holes are configured to allow gas to pass from around the plurality of permanent magnets during drawn down of the PVD chamber to a vacuum state, wherein the plurality of permanent magnets are inserted into vertical holes in the reflector assembly and have a diameter of approximately 0.5 inches to approximately 0.75 inches and a height of approximately 2.0 inches to approximately 3.0 inches, wherein the reflector assembly has cooling channels that are configured to cool the reflector assembly and the plurality of permanent magnets to approximately 65 degrees Celsius, and/or wherein the plurality of permanent magnets are configured to provide perpendicular ion trajectories onto the substrate in the edge region of the substrate.

In some embodiments, an apparatus for influencing ion trajectories onto a substrate may comprise a heat reflector assembly configured to completely surround a periphery of the substrate during processing in a physical vapor deposition (PVD) chamber, wherein the heat reflector assembly configured to reflow deposition material deposited on the substrate and wherein the heat reflector assembly includes cooling channels that are configured to cool the heat reflector assembly and a plurality of discrete permanent magnets inserted into vertical holes in the heat reflector assembly and spaced symmetrically around the heat reflector assembly, wherein the plurality of discrete permanent magnets configured to influence ion trajectories at an edge region of the substrate during plasma deposition and affect deposition uniformity in the edge region of the substrate, wherein the plurality of discrete permanent magnets have a diameter of approximately 0.5 inches to approximately 0.75 inches and a height of approximately 2.0 inches to approximately 3.0 inches, and wherein the plurality of discrete permanent magnets have a maximum energy product of at least 45 MGOe.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
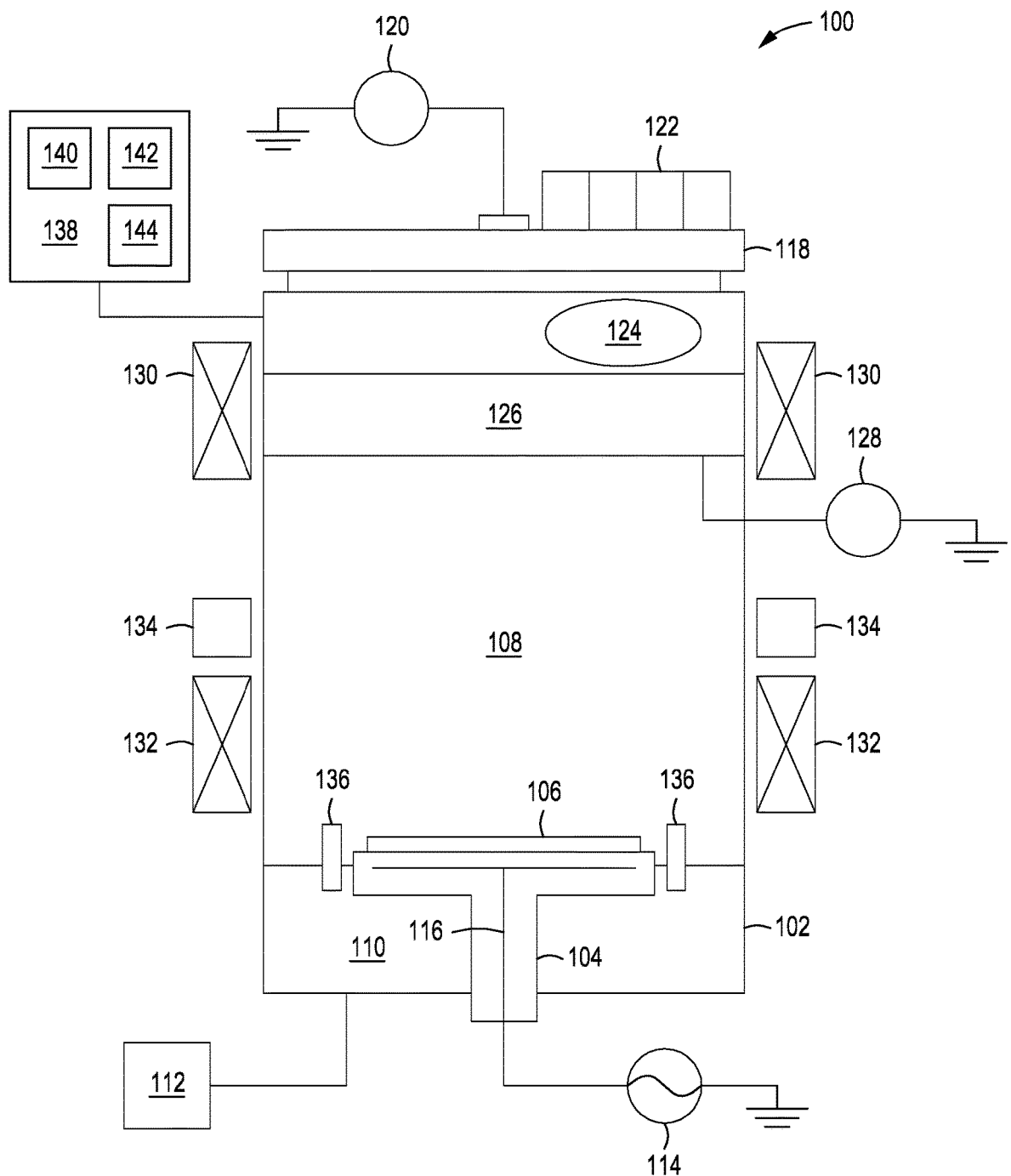
FIG. 1 depicts a cross-sectional view of a process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Ion capture at the wafer plane varies with the magnetic field strength and orientation. The apparatus of the present principles provides hardware consisting of permanent magnets at the wafer-level which enable stronger normal magnetic field lines at the wafer plane. In some semiconductor chamber designs, the strength and orientation of the magnetic field at the wafer plane is controlled by electromagnets positioned above the wafer plane external to the process chamber. Because the electromagnets are above the wafer plane, the electromagnets have limitations in ensuring normal B-field orientation especially at the wafer edge which results in ion loss at the wafer edge region. The apparatus of the present principles addresses the lack of normal B-field orientation at the wafer-level and provides an efficient way to enable a uniform and stronger, normal magnetic field lines across the entire wafer plane which helps in the reduction of ion loss.

The apparatus of the present principles uses the addition of a plurality of discrete permanent magnets at wafer-level in the vacuum space of the process chamber close to the wafer edge region, achieving a strong normal magnetic field at the wafer edge. The apparatus provides a cost-effective enhancement to existing chamber setups which will enable better physical vapor deposition (PVD) film properties due to increased ion flux. The apparatus of the present principles also has the advantage of offering a tuning knob to improve PVD film properties (by tuning step coverage and tuning deposition rate) through improved ion capture through customization of the apparatus and the parameters of the discrete permanent magnets. The apparatus is also economical and does not require any electrical or power integration and does not require any change in chamber software to operate the apparatus. The apparatus may also afford greater tunability of other electromagnets external to the process chamber that are used in conjunction with the apparatus to further enhance film deposition quality.

In a view 100 of FIG. 1, a process chamber 102 that may incorporate the apparatus of the present principles is depicted. The process chamber 102 has a substrate support 104 that allows a substrate 106 to be held during processing. The process chamber 102 includes a processing volume 108 in which the substrate 106 is processed and a non-processing volume 110 that is in fluid contact with a vacuum pump 112 and the processing volume 108. The vacuum pump 112 allows the processing volume 108 to be pumped down to operate in a vacuum during processing. The substrate support 104 may include an electrode 116 that is connected to an RF power supply 114 for biasing the substrate 106 during processing. The process chamber 102 may also include an upper electrode 118 that is electrically connected to a plasma DC power supply 120. The process chamber 102 may also include a controller 138. The controller 138 controls the operation of the process chamber 102 using direct control or alternatively, by controlling the computers (or controllers) associated with the process chamber 102.

In operation, the controller 138 enables data collection and feedback from the respective apparatus and systems to optimize performance of the process chamber 102. The controller 138 generally includes a Central Processing Unit (CPU) 140, a memory 142, and a support circuit 144. The CPU 140 may be any form of a general-purpose computer processor that can be used in an industrial setting. The support circuit 144 is conventionally coupled to the CPU 140 and may comprise a cache, clock circuits, input/output subsystems, power supplies, and the like. Software routines, such as a method as described below may be stored in the memory 142 and, when executed by the CPU 140, transform the CPU 140 into a specific purpose computer (controller 138). The software routines may also be stored and/or executed by a second controller (not shown) that is located remotely from the process chamber 102.

The memory 142 is in the form of computer-readable storage media that contains instructions, when executed by the CPU 140, to facilitate the operation of the semiconductor processes and equipment. The instructions in the memory 142 are in the form of a program product such as a program that implements deposition methods and the like that include the performance parameters of the apparatus to properly tune the depositions. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 10:
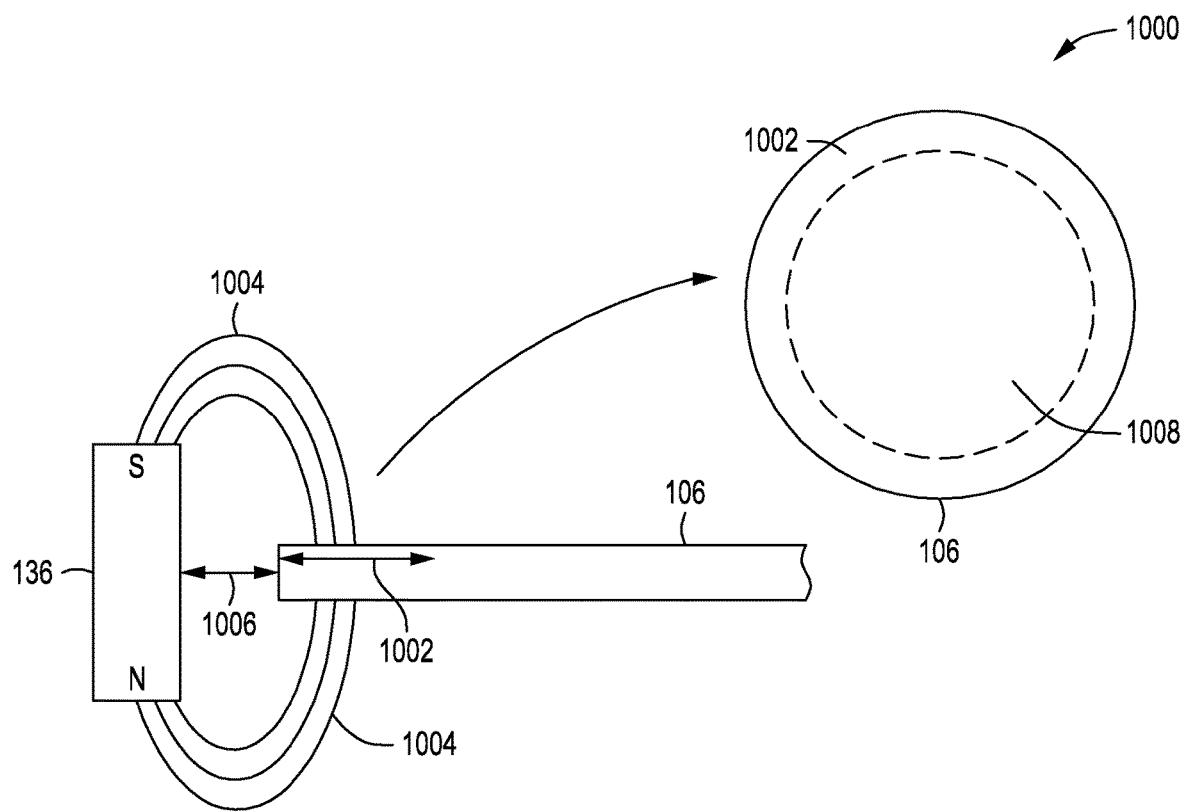
FIG. 10 depicts a cross-sectional and top down view of a substrate in accordance with some embodiments of the present principles.

A magnet assembly 122 may also be used to control plasma 124 generated in the process chamber 102. A collimator 126 electrically connected to a collimator DC power supply 128 may also be used to influence ion trajectories. A first external electromagnet assembly 130 may be used in conjunction with the collimator 126 to additionally influence ion trajectories. A second external electromagnet assembly 132 may also be used closer to the substrate support 104 to further influence ion trajectories. In some instances, an external permanent magnet assembly 134 may be disposed between the first external magnet assembly and the second external electromagnet assembly 132. Despite the multiple assemblies used to influence ion trajectories, the inventors have observed that deposition thicknesses near the edges of the substrates are typically thinner than the central portions of the substrate due to the ion trajectories being less than perpendicular (normal) to the top surface of the substrate. The inventors have found that if a plurality of permanent magnets 136 are symmetrically placed around the substrate support 104 such as, for example, in vacuum space, the film non-uniformity is reduced, especially at the edge region 1002 of the substrate 106 as depicted in a view 1000 of FIG. 10.

In some embodiments, the permanent magnets 136 are oriented in a south pole up configuration. The magnetic fields 1004 (B-fields) impinge upon the substrate 106 at the edge region 1002. The magnetic fields 1004 of the permanent magnets 136 are dramatically reduced as the distance 1006 between the magnet and the substrate 106 increases, reducing effect of the magnetic fields 1004 on the center portion 1008 of the substrate 106. The strength of the magnetic fields of the permanent magnetics may be adjusted by using different magnetic materials with varying magnetic properties to increase or decrease the magnetic fields, decreasing or increasing the volume of the magnetic material to decrease or increase the strength of the magnetic fields, respectively, and/or decreasing or increasing the number of the permanent magnets to decrease or increase the number and placement of the magnetic fields, respectively. As film uniformity is high desirable, placing the permanent magnets symmetrically around the substrate aids in increasing the deposition uniformity. In some embodiments, the permanent magnets may be formed of a magnetic material with a maximum energy product of at least 45 MGOe (Mega (Millions of) Gauss Oersted) or N45. The permanent magnets 136 may be symmetrically spaced around the substrate 106 in an annular assembly to hold the permanent magnets in place. In some embodiments, 16 cylindrical permanent magnets may be used to surround the substrate 106. As the volume of the magnetic material affects the strength of the permanent magnets, in some embodiments, the permanent magnets may have a diameter of approximately 0.5 inches to approximately 0.75 inches and a height of approximately 2.0 inches to approximately 3.0 inches. In some embodiments, the diameter of the permanent magnets is approximately 0.5 inches and approximately 2.0 inches in length.

Figure 11:
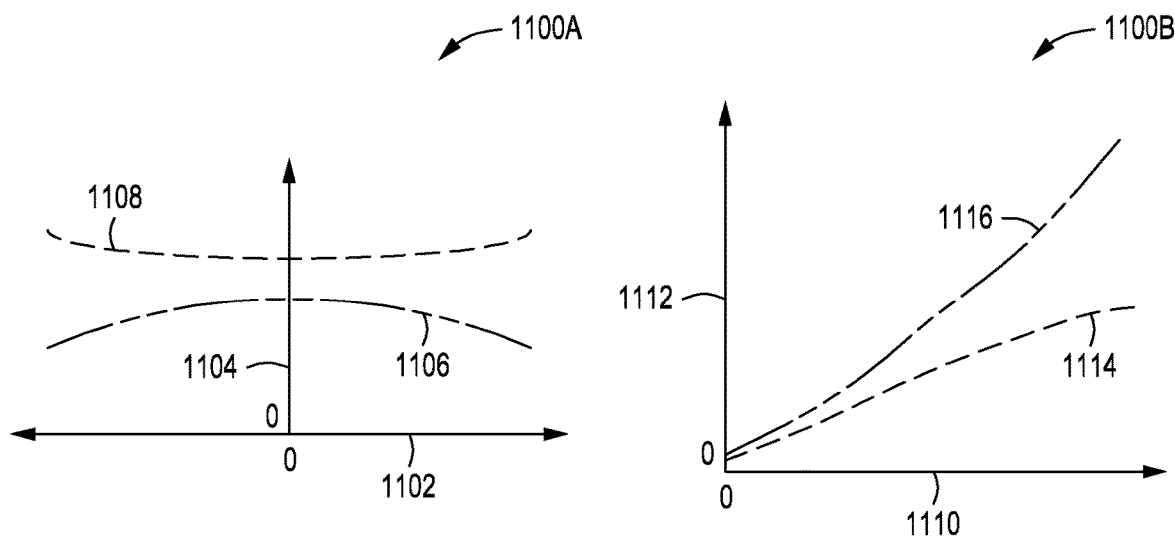
FIG. 11 depicts graphs of effects of magnetic fields on ion trajectories in accordance with some embodiments of the present principles.

As depicted in a graph 1100A of FIG. 11, a gauss level plot 1104 over a radius 1102 of a substrate shows a first gauss level 1106 over the substrate without a plurality of permanent magnets versus a second gauss level 1108 over the substrate with a plurality of permanent magnets surrounding the substrate. The plurality of permanent magnets improves the gauss level near the edge region of the substrate by approximately 10 to approximately 20 gauss or more. The gauss level improvement is influenced by the distance of the magnets to the substrate, the number of magnets, the strength of the magnet material, and/or the total volume of the magnetic material and can be tuned accordingly using the parameters. The inventors also discovered, as depicted in a graph 1100B of FIG. 11, (the x-axis 1110 is the radial distance from the center of the substrate and y-axis 1112 is the delta angle compared to normal of the ions impinging on the top surface of the substrate) that the angle of impingement of the ions is further from normal 1116 towards the edges of the substrate. By incorporating the present apparatus, the angle of impingement of the ions during deposition near the edge region of the substrate is more normalized 1114, increasing deposition uniformity. The more normalized the ion angle of impingement, the more ions are captured at the surface of the substrate. The less normalized the ion angle of impingement, the more ions that are lost, reducing deposition. As the B-fields become stronger and more normalized, the ion trajectories will also become more normalized, improving deposition quality by increasing the deposition thickness through higher ion capture at the substrate surface.

Figure 2:
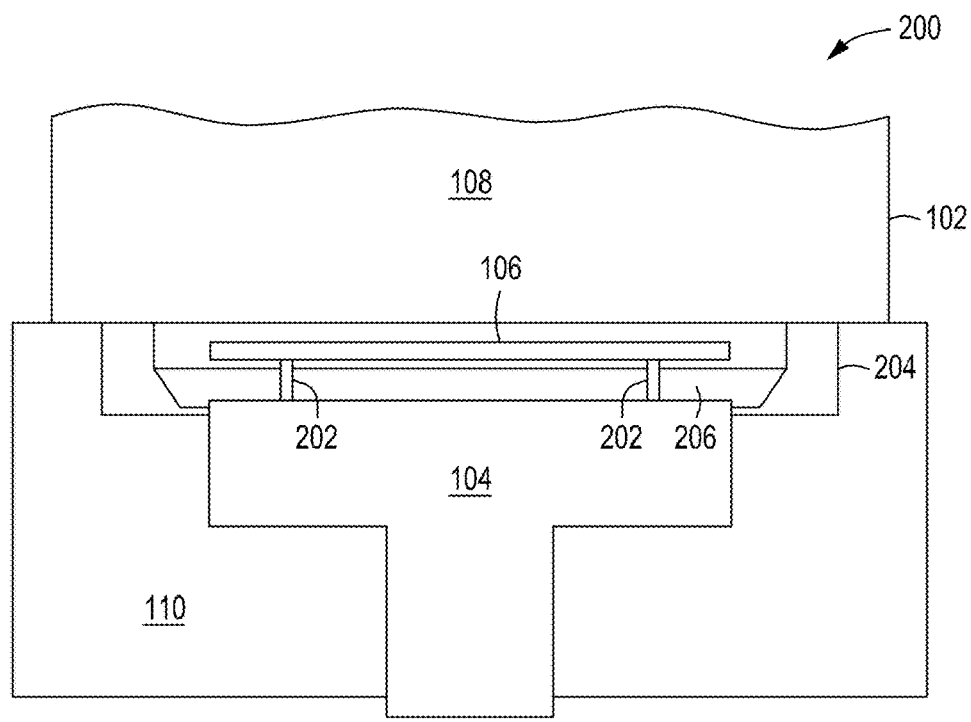
FIG. 2 depicts a cross-sectional view of a process chamber with a reflector assembly in accordance with some embodiments of the present principles.
Figure 3:
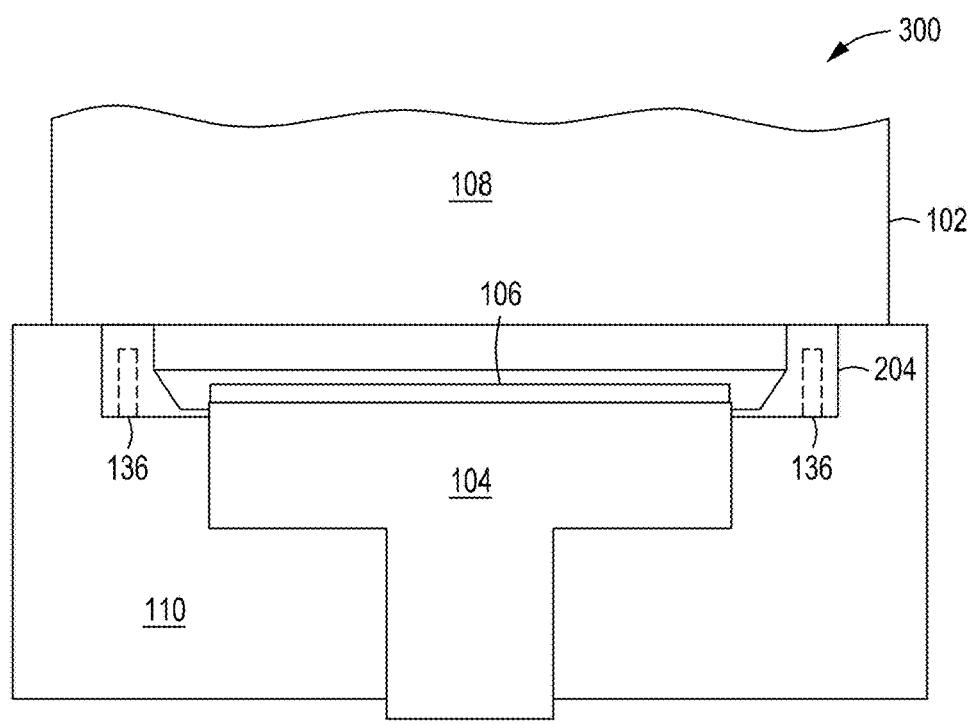
FIG. 3 depicts a cross-sectional view of a process chamber with a modified reflector assembly in accordance with some embodiments of the present principles.

As depicted in a view 200 of FIG. 2, some process chambers may have a reflector assembly 204 that is used during deposition reflow processes. In order to heat the bottom surface of the substrate 106, the substrate 106 is lifted upwards on pins 202 such that the bottom surface is exposed above a reflective portion 206 of the reflector assembly 204. By using the reflector assembly 204 to heat the underside of the substrate 106 (by reflecting radiant energy from heating lamps in the process chamber), the reflow temperature of the deposition material is more easily maintained. As discussed above, surrounding the substrate 106 with a plurality of permanent magnets 136 decreases NU % of the substrate 106. As the reflector assembly 204 surrounds the substrate during processing, the reflector assembly may also function as an annular assembly to hold the plurality of permanent magnets 136 symmetrically around the substrate 106 as depicted in a view 300 of FIG. 3.

Figure 4:
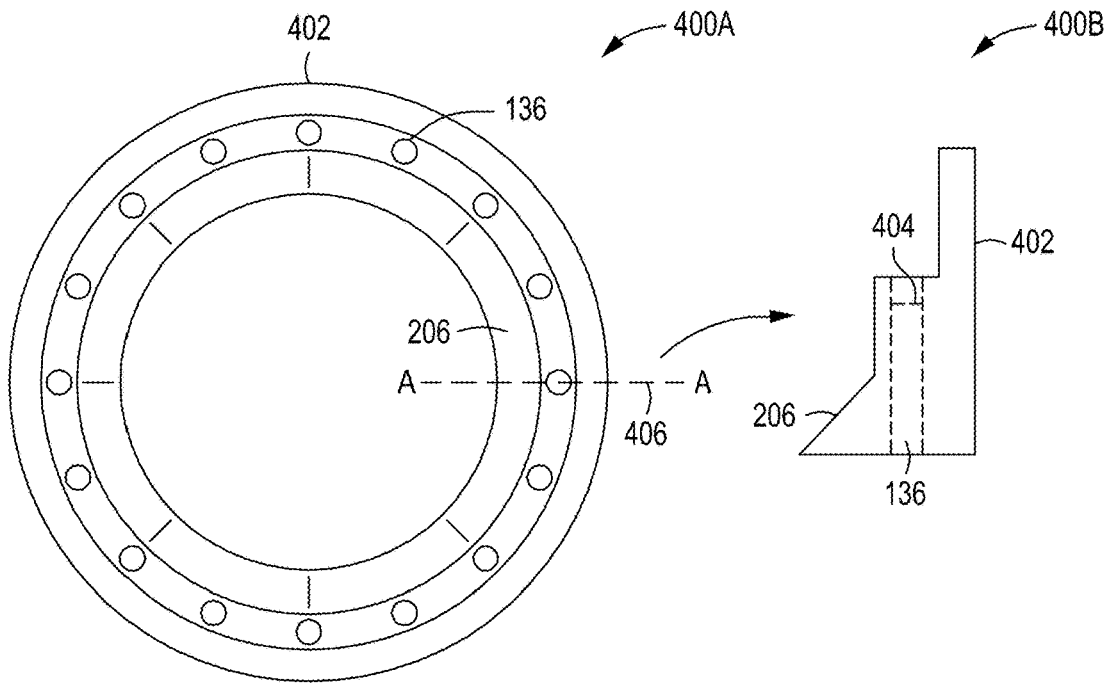
FIG. 4 depicts a top down and cross-sectional view of a reflector assembly in accordance with some embodiments of the present principles.
Figure 5:
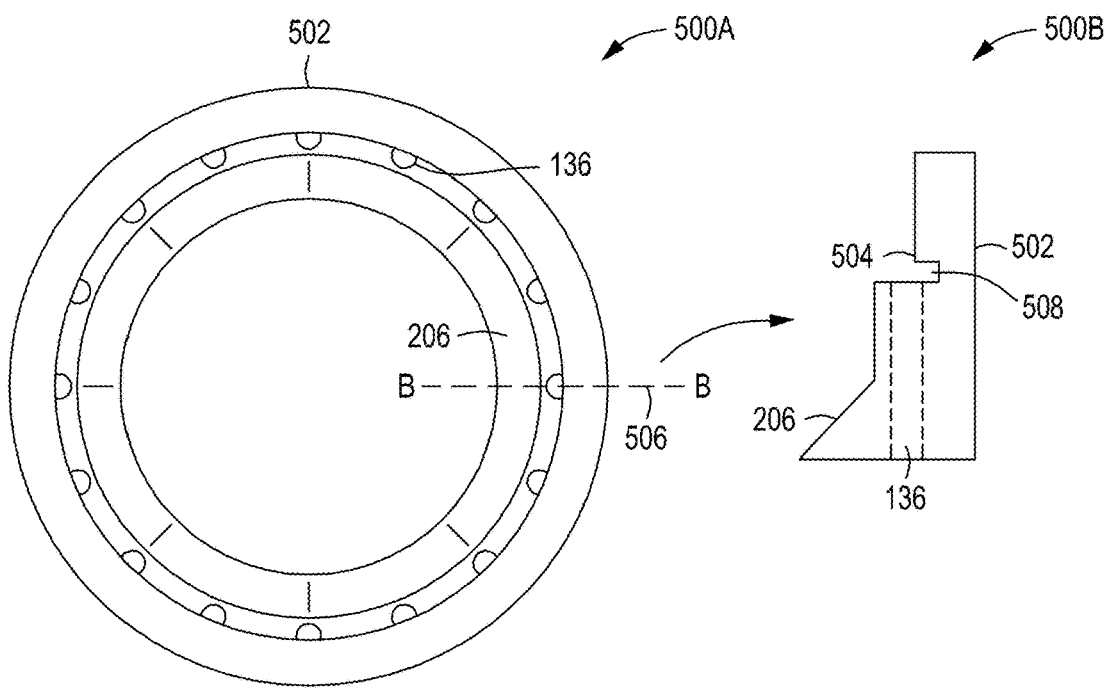
FIG. 5 depicts a top down and cross-sectional view of a reflector assembly in accordance with some embodiments of the present principles.

A top down view 400A of FIG. 4 depicts a reflector assembly 402 that has the permanent magnets 136 symmetrically spaced around the reflector assembly 402. The number of permanent magnets 136 may be altered to adjust the magnetic field on the substrate edge region. A cross-sectional view 400B of FIG. 4 shows the cross-section at line A-A 406 of the top down view 400A. The permanent magnets 136 may be installed in holes that project through the reflector assembly 402 from top to bottom as depicted. In some embodiments, if holes are added to the reflector assembly 402 (as opposed to using existing gas through-holes), blind holes may be used to hold the magnets captive at the top (holes drilled from bottom up to line 404). Otherwise, retention apparatus discussed below for the bottom of the magnets may also be used to retain the magnets at the top. In general, the reflector assembly is used in a stationary device in a top up orientation, and the retention apparatus for the top of the magnets is optional as gravity will generally keep the magnets in place. In a top-down view 500A of FIG. 5, the permanent magnets 136 are partially obscured by an overhang portion 504 of a reflector assembly 502. A cross-sectional view 500B of FIG. 5 shows the cross-section at line B-B 506 of the top-down view 500A. The overhang portion 504 aids in retaining the permanent magnets 136 at the top. An annular recess 508 is formed in the reflector assembly 502 above and outer of the holes to form the overhang portion 504. The permanent magnets 136 may move slightly upward but cannot move past the overhang portion 504, negating any need to have a retention apparatus for the top of the magnets.

Figure 6:
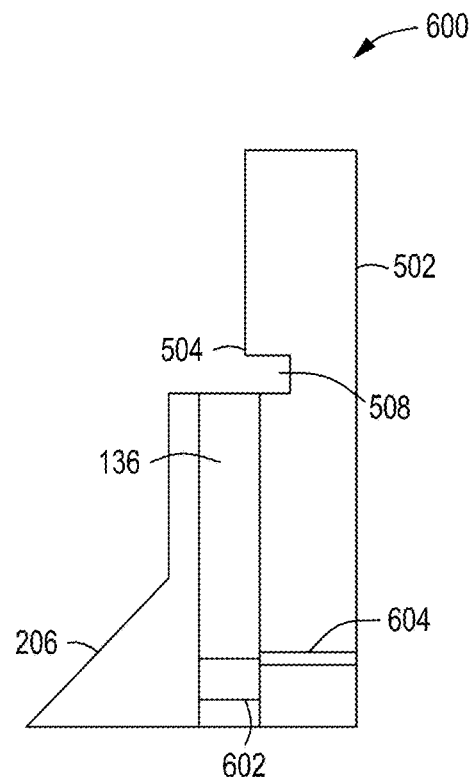
FIG. 6 depicts a cross-sectional view of a reflector assembly with a lateral gas relief in accordance with some embodiments of the present principles.
Figure 7:
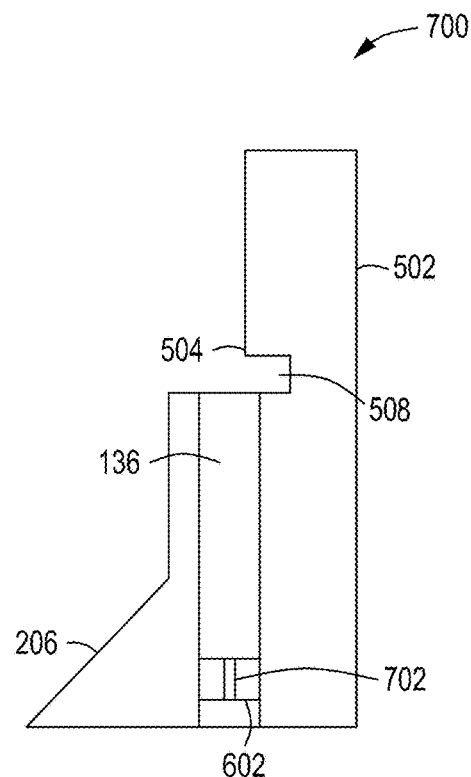
FIG. 7 depicts a cross-sectional view of a reflector assembly with a vertical gas relief in accordance with some embodiments of the present principles.
Figure 8:
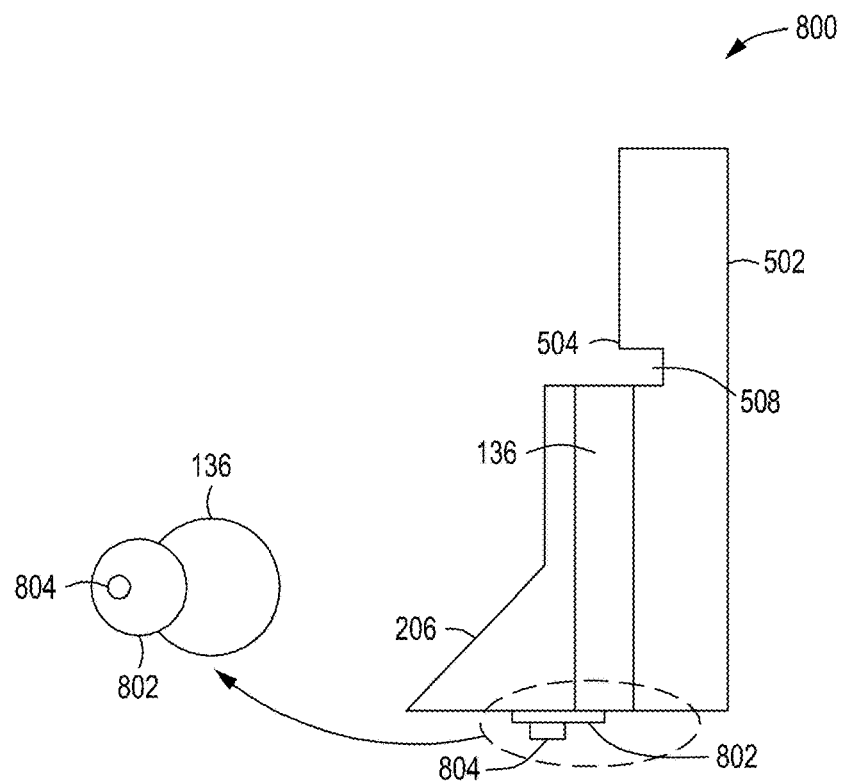
FIG. 8 depicts a cross-sectional view of a reflector assembly with a captive washer retention apparatus in accordance with some embodiments of the present principles.

In a cross-sectional view 600 in FIG. 6, the reflector assembly 502 has a plug 602 inserted below the permanent magnets 136 as a retention apparatus to keep the permanent magnets 136 from falling out of the bottom of the reflector assembly 502. In some embodiments, the reflector assembly 502 may also have fluid conductance tubes to connect the processing volume 108 and the non-processing volume 110 during vacuum draw down of the process chamber 102 (see FIG. 1). When the vacuum draw down occurs, any gases around the permanent magnets 136 will cause back pressure which will attempt to eject the permanent magnets 136. In some embodiments, a lateral gas relief 604 may be provided in the outer side of the reflector assembly to allow any gases to be removed and prevent any back-pressure build-up during vacuum draw down of the chamber. In a cross-sectional view 700 in FIG. 7, a vertical gas relief 702 is provided through the plug 602 in some embodiments to allow gas to escape from around the permanent magnets 136 during vacuum draw down of the process chamber 102. In some embodiments, in order to maximum the size of the permanent magnets, a retention apparatus such as a captive washer 802 and retaining screw 804 may be used to keep the permanent magnets in place in the reflector assembly 502 as depicted in a view 800 of FIG. 8. The captive washer 802 does not need to completely cover the permanent magnet bottom but cover the bottom enough to prevent the permanent magnet from becoming displaced during processing.

Figure 9:
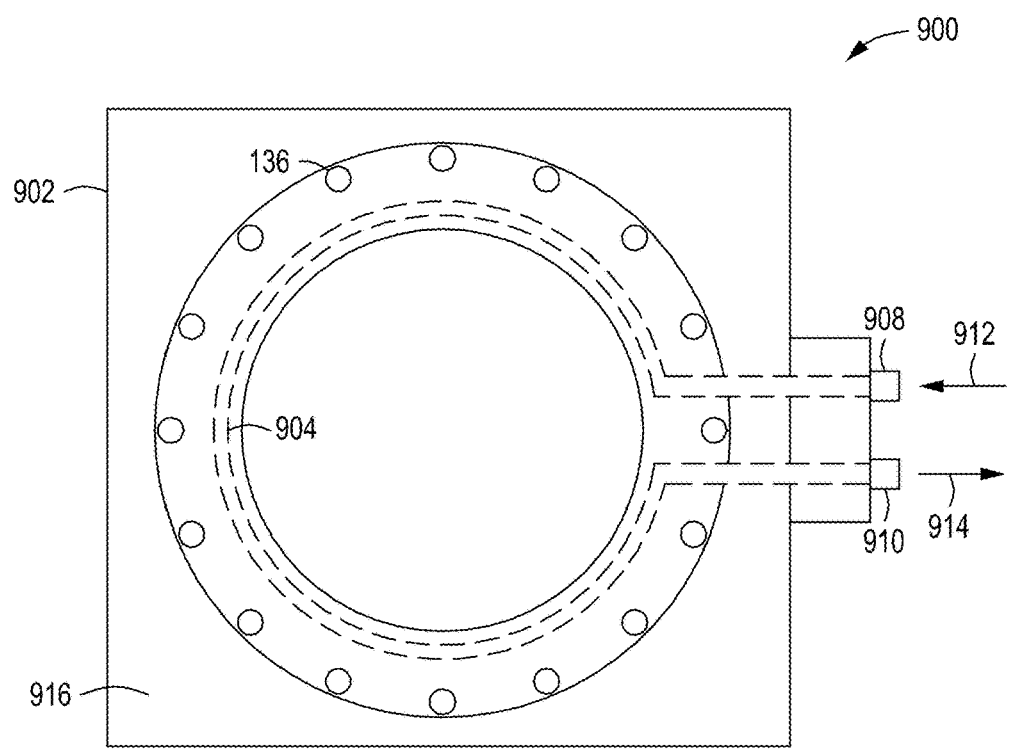
FIG. 9 depicts a bottom view of a reflector assembly with fluid cooling in accordance with some embodiments of the present principles.

The inventors have also found an additional benefit of using some reflector assemblies that are cooled. Permanent magnets lose magnetic properties when temperatures in the process chamber go beyond, for example, curing temperatures (e.g., beyond approximately 100 degrees Celsius). In some embodiments such as depicted in a view 900 of FIG. 9, a reflector assembly 902 has an optional flange 916 that aids in installing the reflector assembly 902 in the process chamber 102 and a fluid cooling channel 904. the fluid cooling channel 904 has an inlet connector 908 for incoming fluid 912 and an outlet connector 910 for outgoing fluid 914. The outgoing fluid 914 typically goes to a heat exchanger (not shown) that cools the fluid and sends the fluid back as the incoming fluid 912. When the permanent magnets 136 are installed in the reflector assembly 902, the reflector assembly 902 is cooled, and the permanent magnets are also cooled. The cooling of the permanent magnets 136 keeps the permanent magnets 136 operating at maximum magnetic field strength by removing heat from the magnets during processing of the substates. In some embodiments, the cooling of the reflector assembly 902 is maintained at approximately 65 degrees Celsius or less, optimizing the magnetic field strength of the permanent magnets.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for influencing ion trajectories onto a substrate, comprising:
    an annular assembly configured to completely surround a periphery of the substrate in a physical vapor deposition (PVD) chamber;
    one or more of a plurality of discrete permanent magnets each embedded in the annular assembly in a vertical pole orientation and spaced symmetrically around the annular assembly in respective one or more insertion holes, the one or more of the plurality of discrete permanent magnets is configured to form magnetic field lines between a south pole and a north pole of each one of the one or more of the plurality of discrete permanent magnets;
    an annular recess formed in the annular assembly above and outer of the one or more insertion holes; and
    an annular overhang formed above the annular recess of the annular assembly and above a portion of each of the one or more insertion holes, wherein the annular overhang is configured to retain the one or more of the plurality of discrete permanent magnets at a top by limiting upward movement of the one or more of the plurality of discrete permanent magnets.

2. The apparatus of claim 1, wherein the annular assembly is a reflector with a sloping inner portion that is configured to reflect radiant energy towards a bottom surface of the substrate.

3. The apparatus of claim 1, wherein one or more of the plurality of discrete permanent magnets is retained in the annular assembly by a plug inserted beneath the one or more of the plurality of discrete permanent magnets and the annular overhang.

4. The apparatus of claim 3, wherein the plug includes a gas relief hole.

5. The apparatus of claim 1, wherein the one or more of the plurality of discrete permanent magnets is retained in the annular assembly by a captive retention apparatus configured to at least partially block the one or more insertion holes at a bottom.

6. The apparatus of claim 1, further including one or more gas relief holes in the annular assembly, wherein the one or more gas relief holes are configured to allow gas to pass from around the one or more of the plurality of discrete permanent magnets during drawn down of the PVD chamber.

7. The apparatus of claim 1, wherein the one or more of the plurality of discrete permanent magnets is a cylindrical magnet that is inserted into the one or more insertion holes in the annular assembly.

8. The apparatus of claim 7, wherein the one or more of the plurality of discrete permanent magnets is oriented south pole up.

9. The apparatus of claim 7, wherein the one or more of the plurality of discrete permanent magnets has a diameter of approximately 0.5 inches to approximately 0.75 inches and a height of approximately 2.0 inches to approximately 3.0 inches.

10. The apparatus of claim 1, wherein the one or more of the plurality of discrete permanent magnets has a maximum energy product of at least 45 MGOe.

11. The apparatus of claim 1, wherein the annular assembly has cooling channels that are configured to cool the annular assembly and the one or more of the plurality of discrete permanent magnets, wherein the cooling channels are separated from the one or more of the plurality of discrete permanent magnets.

12. The apparatus of claim 1, wherein the one or more of the plurality of discrete permanent magnets is configured to provide an increase in B-field of approximately 15 gauss at an edge region of the substrate.

13. The apparatus of claim 1, wherein the one or more of the plurality of discrete permanent magnets is configured to provide magnetic field lines between respective poles of each of the plurality of discrete permanent magnets that intersect with the substrate to generate perpendicular ion trajectories onto the substrate in an edge region of the substrate.

14. The apparatus of claim 1, wherein the one or more of the plurality of discrete permanent magnets includes at least 16 magnets.

15. An apparatus for depositing copper onto a substrate, comprising:
a physical vapor deposition (PVD) chamber with a processing volume that is configured to deposit the copper on the substrate and configured to reflow the copper deposited on the substrate using a radiant energy reflector assembly with an annular shape;
a substrate support that is configured to hold the substrate for processing within the PVD chamber;
the radiant energy reflector assembly surrounds the substrate support and is configured to direct radiant energy towards a bottom surface of the substrate;
one or more of a plurality of permanent magnets each embedded in the radiant energy reflector assembly in a vertical pole orientation that is configured to form magnetic field lines between a south pole and a north pole of each one of the plurality of permanent magnets, the one or more of the plurality of permanent magnets is spaced symmetrically around the radiant energy reflector assembly in respective one or more insertion holes;
an annular recess formed in the radiant energy reflector assembly above and outer of the one or more insertion holes; and
an annular overhang formed above the annular recess of the radiant energy reflector assembly and above a portion of each of the one or more insertion holes, wherein the annular overhang is configured to retain the one or more of the plurality of permanent magnets at a top by limiting upward movement of the one or more of the plurality of permanent magnets.

16. The apparatus of claim 15, further including one or more gas relief holes in the radiant energy reflector assembly, wherein the one or more gas relief holes are configured to allow gas to pass from around the one or more of the plurality of permanent magnets during drawn down of the PVD chamber to a vacuum state.

17. The apparatus of claim 15, wherein the one or more of the plurality of permanent magnets has a diameter of approximately 0.5 inches to approximately 0.75 inches and a height of approximately 2.0 inches to approximately 3.0 inches.

18. The apparatus of claim 15, wherein the radiant energy reflector assembly has cooling channels, separated from the one or more of the plurality of permanent magnets, that are configured to cool the radiant energy reflector assembly and the one or more of the plurality of permanent magnets to approximately 65 degrees Celsius.

19. The apparatus of claim 15, wherein the one or more of the plurality of permanent magnets is configured to provide the magnetic field lines between respective poles of each of the plurality of permanent magnets such that the magnetic field lines intersect with a top surface of the substrate to generate perpendicular ion trajectories onto the substrate in an edge region of the substrate.

20. An apparatus for influencing ion trajectories onto a substrate, comprising:
a radiant energy reflector assembly configured to completely surround a periphery of a substrate support in a physical vapor deposition (PVD) chamber, wherein the radiant energy reflector assembly is configured to be positioned internally to the PVD chamber to direct radiant energy towards a bottom surface of the substrate, wherein the radiant energy reflector assembly includes cooling channels that are configured to cool the radiant energy reflector assembly, and wherein the cooling channels are separated from one or more of a plurality of discrete permanent magnets;
the one or more of the plurality of discrete permanent magnets each inserted into respective one or more insertion holes in the radiant energy reflector assembly in a vertical pole orientation and spaced symmetrically around the radiant energy reflector assembly in the one or more insertion holes, wherein the one or more of the plurality of discrete permanent magnets have a diameter of approximately 0.5 inches to approximately 0.75 inches and a height of approximately 2.0 inches to approximately 3.0 inches, and wherein the one or more of the plurality of discrete permanent magnets have a maximum energy product of at least 45 MGOe;
an annular recess formed in the radiant energy reflector assembly above and outer of the one or more insertion holes; and
an annular overhang formed above the annular recess of the radiant energy reflector assembly and above a portion of each of the one or more insertion holes, wherein the annular overhang is configured to retain the one or more of the plurality of discrete permanent magnets at a top by limiting upward movement of the one or more of the plurality of discrete permanent magnets.

* * * * *